US007224562B2

(12) United States Patent

Tani

(10) Patent No.: US 7,224,562 B2

(45) Date of Patent: May 29, 2007

(54) SHORT-CIRCUIT PROTECTIVE CIRCUIT

(75) Inventor: Katsuhiko Tani, Fukui (JP)

(73) Assignee: Orion Electric Co., Ltd., Takefu, Fukui (JP)

(*) Notice: Subject to any disclaimer, the term of this patent is extended or adjusted under 35 U.S.C. 154(b) by 67 days.

(21) Appl. No.: 11/015,522

(22) Filed: Dec. 17, 2004

(65) Prior Publication Data

US 2005/0141152 A1 Jun. 30, 2005

(30) Foreign Application Priority Data

Dec. 26, 2003 (JP) ............................ 2003-432161

(51) Int. Cl.

| | |
|---|---|
| ***H02H 3/24*** | (2006.01) |
| *H02H 7/00* | (2006.01) |
| *H02H 9/00* | (2006.01) |
| *G01N 27/72* | (2006.01) |
| *G01R 33/12* | (2006.01) |
| *G05F 1/00* | (2006.01) |

(52) U.S. Cl. .......................... 361/92; 361/18; 323/234; 323/272

(58) Field of Classification Search .................. 361/92, 361/18; 323/234, 272

See application file for complete search history.

(56) References Cited

U.S. PATENT DOCUMENTS

| | | | | |
|---|---|---|---|---|
| 6,674,270 B2 * | 1/2004 | Sakamoto | ................... | 323/272 |
| 2004/0108842 A1 * | 6/2004 | Oyama et al. | .............. | 323/267 |

FOREIGN PATENT DOCUMENTS

| | | |
|---|---|---|
| JP | 05-252649 | 9/1993 |
| JP | 05-292655 | 11/1993 |
| JP | 06-177661 | 6/1994 |
| JP | 07-211869 | 8/1995 |
| JP | 09-034569 | 2/1997 |
| JP | 10-111722 | 4/1998 |
| JP | 11-004531 | 1/1999 |
| JP | 2002-358130 | 12/2002 |

* cited by examiner

*Primary Examiner*—Stephen W. Jackson
*Assistant Examiner*—Dharti H. Patel
(74) *Attorney, Agent, or Firm*—Flynn, Theil, Boutell & Tanis, P.C.

(57) ABSTRACT

The invention provides a short-circuit protective circuit for a constant-voltage power-supply circuit. The constant-voltage power-supply circuit can realize a short-circuit protection with a simple circuit configuration in a power-supply circuit provided with a plurality of power-supply lines. A regulator is connected to one of a plurality of power-supply lines, and a constant voltage is outputted from an output terminal of the regulator through an output line. An output voltage from the regulator is inputted to constant-voltage circuits as a reference voltage, and output constant voltages from the constant-voltage circuits are supplied to the other output lines. A voltage detection circuit is connected to the other output lines, wherein if a voltage drop occurs in any output line, a detection signal is outputted to an operation circuit, thereby turning off an output control terminal of the regulator. Accordingly, the output of the regulator is stopped so that all of the output lines are stopped all at once. The invention is cost-efficient because the invention uses only one regulator to control multiple power-supply lines.

5 Claims, 1 Drawing Sheet

SHORT-CIRCUIT PROTECTIVE CIRCUIT

FIELD OF THE INVENTION

The invention relates to a short-circuit protective circuit for a constant-voltage power-supply circuit provided with a plurality of power-supply lines.

BACKGROUND OF THE INVENTION

As for a constant-voltage power-supply circuit, a voltage of a power-supply line is controlled to maintain a constant voltage by connecting a regulator to the power-supply line, wherein if a load circuit is short-circuited at an output side of the regulator owing to some causes, a voltage drop occurs, so that a large current flows into the regulator, causing the breakage of the regulator owing to overheat of the regulator.

To cope with such a problem, a short-circuit protective circuit is provided in the constant-voltage power-supply circuit. For example, JP 5-252649A discloses potential detection means for detecting whether the difference between an input voltage and an output voltage of a regulator exceeds a prescribed voltage wherein the output of the regulator is prohibited by controlling an output control input terminal of the regulator. Further, JP 9-34569A discloses that an output voltage is fed back to keep a transistor ON so that a regulator IC keeps its operation to maintain a stabilized output wherein if a load circuit of the output terminal is short-circuited, the voltage is not fed back to the transistor and as a result, the supply of output from the regulator IC is blocked. Still further, JP 2002-358130A discloses the function of a control circuit for turning on and off the output of a regulator IC by detecting an output voltage from an output terminal of the regulator IC.

All of the prior art references set forth above use the regulator provided with the output control terminal for a constant-voltage power-supply circuit, wherein if a voltage at an output side of the regulator drops owing to a short circuit, the voltage is fed back so as to input a stop signal to the output control terminal, thereby stopping the regulator. However, if such a circuit configuration is used for a power-supply circuit provided with a plurality of power-supply lines, the regulator has to be disposed for each power-supply line, resulting in the increase of cost. Further, even if one power-supply line is short-circuited to stop the supply of power, the remaining power-supply lines continue to supply power so that there is a possibility that the short-circuited load circuit influences upon the load circuits connected to the remaining power-supply lines. If the supply of power continues, the waste of power consumption is unavoidable.

SUMMARY OF THE INVENTION

The invention provides a short-circuit protective circuit for a constant-voltage power-supply circuit. The constant-voltage power-supply circuit can realize a short-circuit protection with a simple circuit configuration in a power-supply circuit provided with a plurality of power-supply lines.

The short-circuit protective circuit comprises: 1) a regulator having an input terminal connected to a specific power-supply line among a plurality of power-supply lines, an output terminal for a constant voltage output and an output control terminal for turning on or off the output of the regulator, 2) a plurality of constant-voltage circuits connected to each power-supply line other than the specific power-supply line, each of the constant-voltage circuits supplying a constant voltage for each power-supply line based on the constant voltage supplied from the output terminal of the regulator, 3) a plurality of voltage detection circuits connected to each power-supply line other than the specific power-supply line for detecting a voltage drop at an output side thereof and outputting a detection signal, and 4) an operation circuit connected to the output control terminal of the regulator for stopping the output voltages of the constant-voltage circuits all at once, by stopping the output voltage from the regulator in response to the detection signal outputted from the voltage detection circuit.

With the circuit configuration set forth above, if a voltage drop occurs at any of the power-supply lines, output voltages of all the power-supply lines are stopped, thereby realizing the short-circuit protection. Since the regulator is provided on the specific power-supply line and constant-voltage circuits are provided on the other power-supply lines for supplying constant voltages for the other power-supply lines based on the constant voltage outputted from the regulator, if the output of the regulator is stopped, all the power-supply lines are stopped at output thereof all at once. Accordingly, the constant-voltage circuit at each power-supply line has a function to provide ON/OFF control on the voltage of each power-supply line.

Further, if the voltage detection circuit provided on each power-supply line detects a voltage drop at the output side of the constant voltage circuits, thereby detecting the voltage drop at either power-supply line, the operation circuit sends out a signal to the output control terminal of the regulator to stop the output of the regulator. As a result, if a voltage drop occurs at any of the power-supply lines owing to a short-circuit, the operation circuit stops the output of the regulator.

As mentioned above, a circuit configuration for implementing ON/OFF control over the constant-voltage circuits provided on each power-supply line is not necessary, but a circuit configuration capable of stopping the output of the regulator alone is enough to implement the short-circuit protection, thereby making the circuit configuration simpler and reducing the cost of components.

PREFERRED EMBODIMENT OF THE INVENTION

Figure 1:
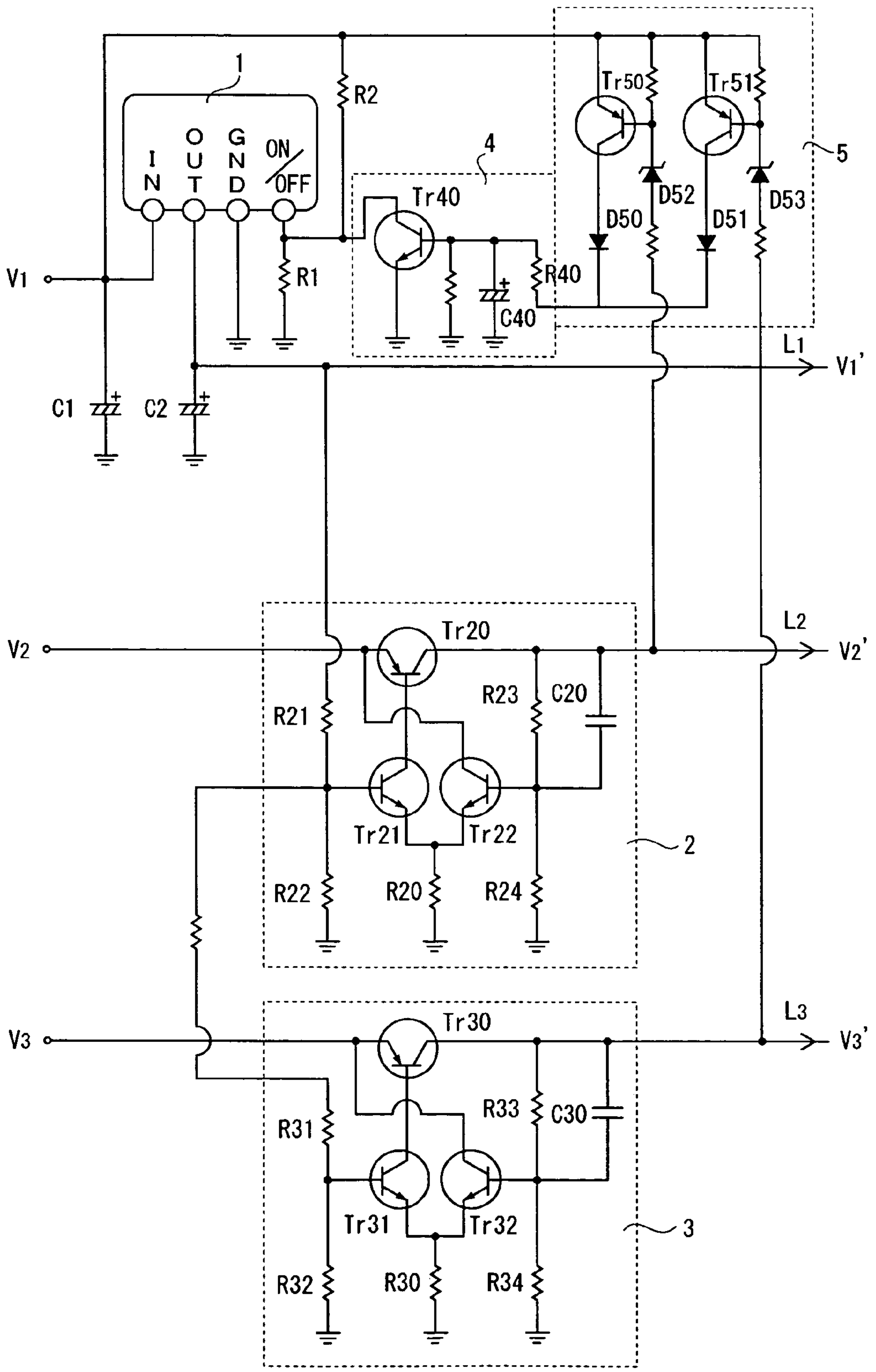
FIG. 1 is a circuit configuration relating to an embodiment of the invention.

An embodiment of the invention will be described in detail. Since the working example described hereinafter is a preferred concrete example for the invention, it is technically limited, but the invention is not limited only to the working example unless the description expressly limits the invention to the working example.

FIG. 1 is a circuit configuration related to the embodiment of the invention. In FIG. 1, voltages V1 to V3 are supplied from a power-supply circuit, not shown, through power-supply lines.

The power-supply line through which the voltage V1 (hereinafter referred to as the power-supply line of the voltage V1) is supplied is connected to the input terminal (IN) of the regulator 1. The regulator 1 has an output terminal (OUT) for outputting a predetermined constant voltage, a ground terminal (GND) to be grounded, an output control terminal (ON/OFF) for turning on or off the output of the regulator 1, and the input terminal (IN), wherein the input and output terminals (IN,OUT) of the regulator 1 are connected to capacitors C1 and C2, respectively, the ground terminal (GND) is grounded as it is, and the output control terminal (ON/OFF) is grounded via a resistor R1 and connected to the power-supply line at the input side of the regulator 1 via a resistor R2. Further, the output terminal (OUT) of the regulator 1 is connected to an output line L1 through which a constant voltage V1' is outputted.

A constant-voltage circuit 2 is connected to the power-supply line through which the voltage V2 is supplied. The constant-voltage circuit 2 has a control transistor Tr20, the emitter of which is connected to the power-supply line through which the Voltage V2 is supplied and a collector of which is connected to an output line L2.

The constant-voltage circuit 2 comprises a pair of transistors Tr21 and Tr22, each having the same characteristics, emitters of which are connected to each other and grounded via a resistor R20. This circuit operates such that a current flowing to common emitter terminals thereof becomes constant and functions like a differential amplifier.

A base terminal of the transistor Tr21 is connected between resistors R21 and R22 wherein the resistor R21 is connected to the output line L1 and the resistor R22 is grounded. Accordingly, a voltage which is obtained by dividing the constant voltage V1' by the resistors R21 and R22 is applied to the base terminal of the transistor Tr21 as a reference voltage. A collector terminal of the transistor Tr21 is connected to a base terminal of the control transistor Tr20.

A base terminal of the transistor Tr22 is connected between resistors R23 and R24 wherein the resistor R23 is connected to the output line L2 and the resistor R24 is grounded. Accordingly, a voltage which is obtained by dividing the constant voltage V2' by the resistors R23 and R24 is applied to the base terminal of the transistor Tr22 as a detection voltage. A collector terminal of the transistor Tr22 is connected to the power-supply line at the input side of the control transistor Tr20. A capacitor C20 is connected to the output line L2 in parallel with the resistor R23.

A constant-voltage circuit 3 is connected to the power-supply line through which the voltage V3 is supplied, and the circuit configuration thereof is the same as that of the constant-voltage circuit 2. An output line L3 is connected to a control transistor Tr30 and a constant voltage V3' is outputted through the output line L3. A base terminal of the transistor Tr31 is connected between resistors R31 and R32 wherein the resistor R31 is connected to the resistors R21 and R22, and the resistor R32 is grounded. Accordingly, a voltage which is obtained by dividing the voltage applied to the transistor Tr21 by the resistors R31 and R32 is applied to the base terminal of the transistor Tr31.

An operation circuit 4 is connected to the output control terminal (ON/OFF) of the regulator 1, and a voltage detection circuit 5 which is connected to the output lines L2 and L3 is connected to the operation circuit 4. The operation circuit 4 has a transistor Tr40 a collector of which is connected to the output control terminal (ON/OFF) of the regulator 1, and an emitter of which is grounded. A resistor R40 and a capacitor C40 are connected to the base terminal of the transistor Tr40, wherein the resistor R40 is connected to the voltage detection circuit 5 and the capacitor C40 is grounded.

A circuit configuration of the voltage detection circuit 5 is as follows. The voltage detection circuit 5 comprises a transistor Tr50 and a diode D50 that are connected between the power-supply line at the input side of the regulator 1 and the resistor R40 in series with each other, a transistor Tr51 and a diode D51 that are connected in parallel with the transistor Tr50 and the diode D50, a Zener diode D52 through which a base terminal of the transistor Tr50 is connected to the output line L2, and a Zener diode D53 through which a base terminal of the transistor Tr51 is connected to the output line L3.

An operation of the short-circuit protective circuit having the above-mentioned circuit configuration will be described as follows. When the voltages V1 to V3 are supplied from the power-supply circuit, not shown, to each power-supply line, the voltage V1 is first supplied to the input terminal (IN) and the output control terminal (ON/OFF) of the regulator 1, thereby turning on the regulator 1. Accordingly, the constant voltage V1' is outputted from the output terminal (OUT) of the regulator 1 to the output line L1.

A voltage that is obtained by dividing the constant voltage V1' by the resistors R21 and R22 is applied to the base terminal of the transistor Tr21 as a reference voltage so that the transistor Tr21 is turned on and the control transistor Tr20 is brought into conduction, thereby outputting a voltage V2' to the output line L2. A detection voltage obtained by dividing the voltage V2' by the resistors R23 and R24 is applied to the base terminal of the transistor Tr22.

As mentioned above, since the transistors Tr21 and Tr22 operate in such a manner that the emitters of the transistors are connected to each other so as to flow a prescribed current, if the voltage V2' varies, the detection voltage applied to the base of the transistor Tr22 also varies, and alters the current to the emitter so that the current to the emitter of the transistor Tr21 varies in response to the change of the current in a manner that the sum of both currents remains constant.

For example, if the detection voltage increases, the current to the emitter of the transistor Tr22 increases, and in response thereto, the current to the emitter of the transistor Tr21 decreases. Accordingly, the detection voltage is controlled such that the current from the base terminal of the control transistor Tr20 to the collector of the transistor Tr21 decreases, and a collector voltage of the control transistor Tr20 decreases.

In such a manner, if the detection voltage applied to the bases of the transistor Tr22 varies, in response thereto, the voltage is controlled such that the collector voltage of the control transistor Tr20 varies so as to allow the voltage V2' to remain constant. Accordingly, the circuit operates such that the reference voltage applied to the base terminal of the transistor Tr21 and the detection voltage applied to the base terminal of the transistor Tr22 remain constant. Since the reference voltage is maintained at a prescribed voltage level based on the output voltage from the regulator 1, the level of the voltage V2' is set such that the detection voltage of the base of the transistor Tr22 remains constant as the reference voltage. Accordingly, the voltage V2' is outputted as the constant voltage that is set based on the reference voltage, and the resistors R23 and R24. The capacitor C20 bypasses the variation of the voltage V2' to reflect it on the base of the transistor Tr22.

Like the constant-voltage circuit 2, the constant-voltage circuit 3 outputs the voltage V3' as a constant voltage that is set based on the reference voltage applied to the base of the transistor Tr31, and the resistors R33 and R34.

The voltage detection circuit 5 operates such that if a potential between both ends of the Zener diode D52, namely, the potential between the voltage at the input side of the regulator 1 and the voltage V2' of the output line L2, exceeds a breakdown voltage of the Zener diode D52, the Zener diode D52 is brought into conduction, and a voltage is applied to the base of the transistor Tr50, thereby turning on the transistor Tr50.

When the transistor Tr50 is turned on, a voltage is applied to the base of the transistor Tr40 through the diode D50 and the resistor R40 so that the transistor Tr40 is turned on.

When the transistor Tr40 is turned on, the output control terminal (ON/OFF) of the regulator 1 becomes a ground voltage, and it is turned off.

When the output control terminal (ON/OFF) of the regulator 1 is turned off, the output therefrom is stopped so that the output voltage of the output line L1 is stopped, and the reference voltage applied to the transistors Tr21 and Tr31 is also stopped, thereby stopping the output voltages from the constant-voltage circuits 2 and 3 all at once.

Accordingly, if the output line L2 is short-circuited for any reason to bring about a voltage drop, the Zener diode D52 is brought into conduction that is detected by the voltage detection circuit 5. As a result, the transistor Tr50 is turned on to output the detection signal to the operation circuit 4, and the transistor Tr40 of the operation circuit 4 is also turned on, thereby stopping the outputs of the output lines L1 to L3 all at once. Therefore, it is possible to prevent a trouble involved in the voltage drop at the output line L2 from influencing upon other circuits even at the very minimum level.

The voltage detection circuit 5 has the Zener diode D53 for detecting the voltage drop of the output line L3 in the same manner as the output line L2. Even in the case where a voltage drop occurs at the output line L3, the voltage detection circuit 5 outputs a detection signal to the operation circuit 4 in the same manner as the case where a voltage drop occurs at the output line L2, thereby stopping the outputs of all the output lines.

The diodes D50 and D51 are connected to each other to prevent reverse-current, while the resistor R40 and the capacitor C40 operate as a time constant circuit so as not to turn on the transistor Tr40 in response to the detection signal from the voltage detection circuit 5 when started.

As mentioned above, if a voltage drop occurs at any of the output lines, outputs of all the output lines are stopped. That is, if a voltage drop occurs at the output line L1, it directly influences upon the output terminal of the regulator 1 so that the output of the regulator 1 is stopped by the known short-circuit protective function incorporated in the regulator 1, thereby stopping the outputs of all the output lines. If a voltage drop occurs at the output line L1 or L2, the detection signal is outputted from the voltage detection circuit 5, thereby having the operation circuit 4 to stop the output of the regulator 1, and hence the outputs of all the output lines are stopped.

If the breakdown voltages of the Zener diodes D52 and D53 are appropriately adjusted, the short-circuit protective circuit can cope with a voltage drop that influences upon other circuits in addition to the case of short circuit. In addition, a detection voltage may be fixed individually for each output line by setting breakdown voltages of the Zener diodes connected to each output line at different values. Furthermore, even if the regulator is restarted, the output thereof is stopped unless the voltage drop of the output line is dissolved, and it does not return to an ordinary state, thereby enhancing safety.

The disclosure of Japanese Patent Application No. 2003-432161 including specification, claims, and drawings, is incorporated herein by reference.

What is claimed is:

1. A short-circuit protective circuit comprising:

a regulator having an input terminal connected to a specific power-supply line among a plurality of power-supply lines, an output terminal for outputting a constant voltage and an output control terminal for turning on or off the output of said regulator;

a plurality of constant-voltage circuits connected to each power-supply line other than said specific power-supply line, each of said constant-voltage circuits supplying a constant voltage for each power-supply line based on the constant voltage supplied from said output terminal of said regulator;

a plurality of voltage detection circuits connected to each power-supply line other than said specific power-supply line for detecting a voltage drop at any output side thereof and outputting a detection signal; and an operation circuit connected to said output control terminal of said regulator for stopping the output voltages of said constant-voltage circuits all at once, by stopping the output voltage from said regulator in response to said detection signal outputted from said voltage detection circuit.

2. A regulator according to claim 1, comprising;

an input terminal connected to said specific power-supply line, an output terminal connected to said constant-voltage circuit and said output line, a ground terminal, and an output control terminal connected to said operation circuit and said specific power-supply line via a resistor.

3. A constant-voltage circuit according to claim 1, comprising;

a first transistor, a collector of which is connected to one of said output lines, a base of which is connected to a second transistor, and an emitter of which is connected to a third transistor and said one of power-supply lines other than said specific power-supply line, a second transistor, a collector of which is connected to a base of said first transistor, a base of which is connected to one of said output lines via a resistor, to ground via a resistor, and to other constant-voltage circuit via a resistor, and an emitter of which is connected to ground via a resistor and to a third transistor, and a third transistor, a collector of which is connected to an emitter of said first transistor, a base of which is connected to one of said output lines via a resistor and a capacitor in parallel, and to ground via a resistor, and an emitter of which is connected to ground via a resistor and to said second transistor.

4. A voltage detection circuit according to claim 1, comprising;

a transistor, a collector of which is connected to a diode, an emitter of which is connected to said specific power-supply line, and a base of which is connected to a Zener diode and said specific power-supply line via a resistor, a diode connected to said transistor and said operation circuit, and a Zener diode connected to said transistor and a resistor for one side, and to one of said output lines via a resistor for the other side.

5. An operation circuit according to claim 1, comprising a transistor, a collector of which is connected to said output control terminal of said regulator and to said specific power-supply line via a resistor, an emitter of which is grounded, and a base of which is connected to a resistor that is grounded, to a capacitor that is grounded, and to said voltage detection circuit via a resistor.

* * * * *